(12) United States Patent
Nakazawa et al.

(10) Patent No.: US 10,461,718 B2
(45) Date of Patent: Oct. 29, 2019

(54) ACOUSTIC WAVE RESONATOR, FILTER, AND MULTIPLEXER

(71) Applicant: TAIYO YUDEN CO., LTD., Tokyo (JP)

(72) Inventors: Hidetaro Nakazawa, Tokyo (JP); Masafumi Iwaki, Tokyo (JP); Tabito Tanaka, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 160 days.

(21) Appl. No.: 15/416,263

(22) Filed: Jan. 26, 2017

(65) Prior Publication Data

US 2017/0264262 A1 Sep. 14, 2017

(30) Foreign Application Priority Data

Mar. 11, 2016 (JP) .................................. 2016-048494

(51) Int. Cl.
*H03H 9/145* (2006.01)
*H03H 9/25* (2006.01)
(Continued)

(52) U.S. Cl.
CPC ...... *H03H 9/1457* (2013.01); *H03H 9/14532* (2013.01); *H03H 9/25* (2013.01); *H03H 9/64* (2013.01); *H03H 9/725* (2013.01)

(58) Field of Classification Search
CPC .... H03H 9/1457; H03H 9/14532; H03H 9/25; H03H 9/64; H03H 9/725
(Continued)

(56) References Cited

U.S. PATENT DOCUMENTS

| 6,791,236 B1* | 9/2004 | Abramov | H03H 9/14505 |
| | | | 310/313 B |
| 7,576,471 B1* | 8/2009 | Solal | H03H 9/02858 |
| | | | 310/313 B |

(Continued)

FOREIGN PATENT DOCUMENTS

| JP | 2013-518455 A | 5/2013 |
| JP | 2014-131351 A | 7/2014 |

(Continued)

OTHER PUBLICATIONS

Japanese Office Action dated Feb. 20, 2018, in a counterpart Japanese patent application No. 2016-048494. (A machine translation (not reviewed for accuracy) attached.).

(Continued)

*Primary Examiner* — Robert J Pascal
*Assistant Examiner* — Jorge L Salazar, Jr.
(74) *Attorney, Agent, or Firm* — Chen Yoshimura LLP

(57) ABSTRACT

An acoustic wave resonator includes: a piezoelectric substrate; and an IDT that is located on the piezoelectric substrate and includes first regions and second regions alternately arranged in an extension direction of electrode fingers, which excite an acoustic wave, in an overlap region in which the electrode fingers overlap, at least one electrode finger of the electrode fingers in the second regions having a different width from the at least one electrode finger in the first regions, a width of an outer second region of the second regions in the extension direction differs from a width of an inner second region of the second regions.

11 Claims, 12 Drawing Sheets

(51) Int. Cl.
*H03H 9/64* (2006.01)
*H03H 9/72* (2006.01)

(58) Field of Classification Search
USPC .......................... 333/133, 193–195; 310/312
See application file for complete search history.

(56) References Cited

U.S. PATENT DOCUMENTS

| | | |
|---|---|---|
| 7,939,987 B1 | 5/2011 | Solal et al. |
| 2012/0306591 A1* | 12/2012 | Nishihara ............... H03H 9/173 333/133 |
| 2013/0051588 A1 | 2/2013 | Ruile et al. |
| 2016/0336919 A1* | 11/2016 | Taniguchi .......... H03H 9/02559 |
| 2017/0331451 A1 | 11/2017 | Yoon et al. |

FOREIGN PATENT DOCUMENTS

| | | |
|---|---|---|
| WO | 2015/007319 A1 | 1/2015 |
| WO | 2016/095967 A1 | 6/2016 |

OTHER PUBLICATIONS

Japanese Office Action dated Aug. 14, 2018, in a counterpart Japanese patent application No. 2016-048494. (A machine translation (not reviewed for accuracy) attached.).

* cited by examiner

FIG. 9A
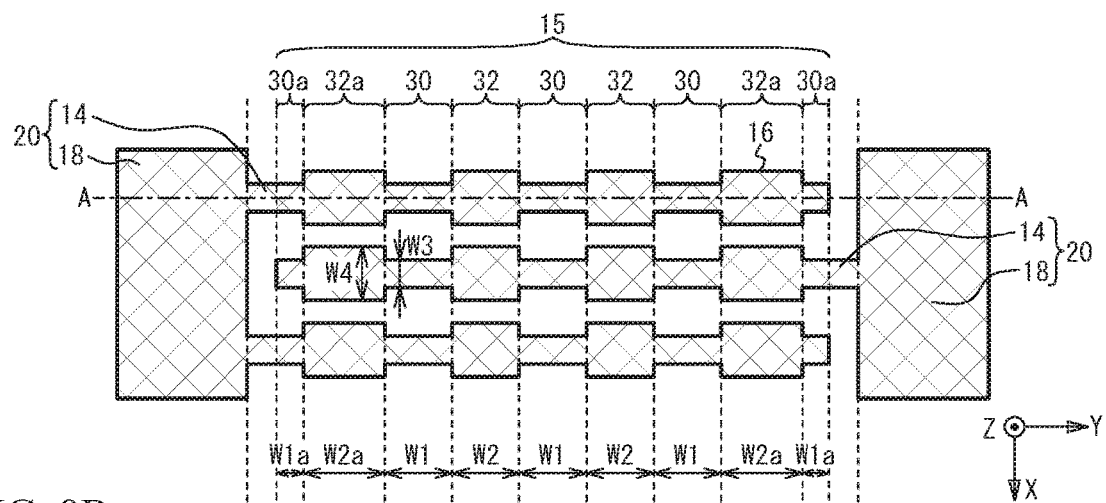
FIG. 9B
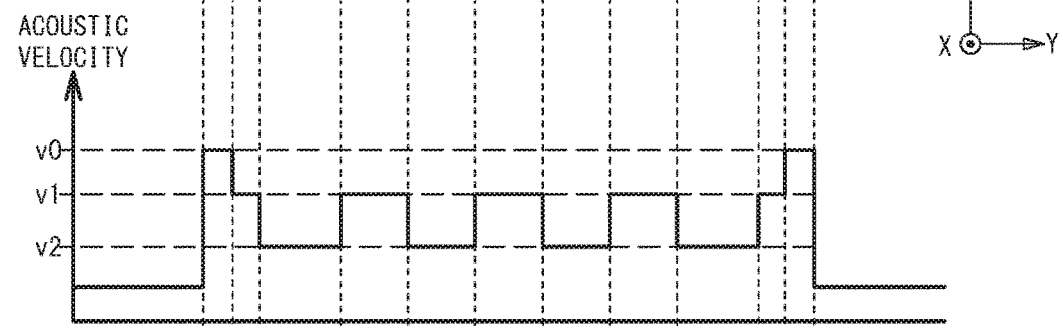
FIG. 9C
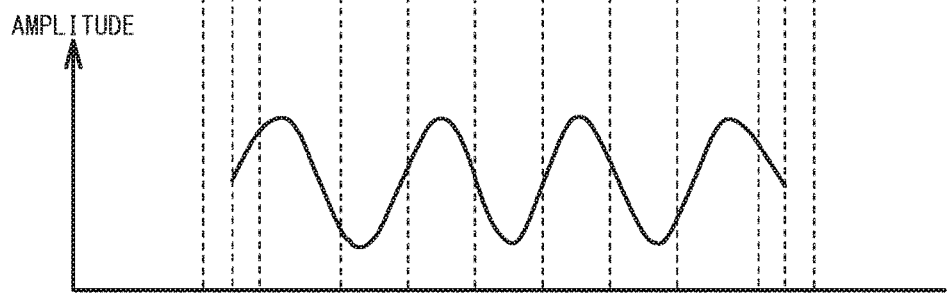
FIG. 9D

FIG. 11A
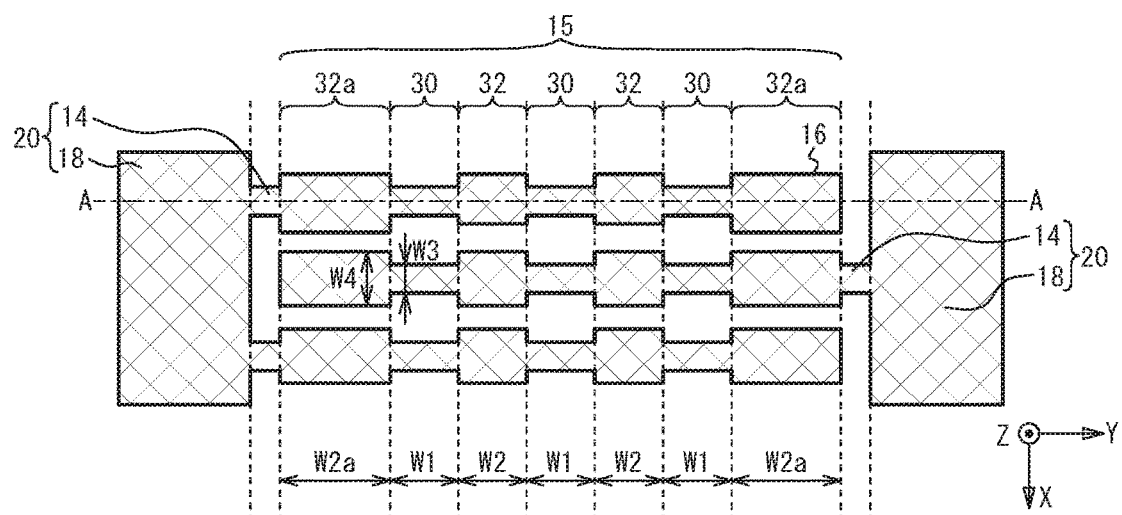
FIG. 11B
FIG. 11C
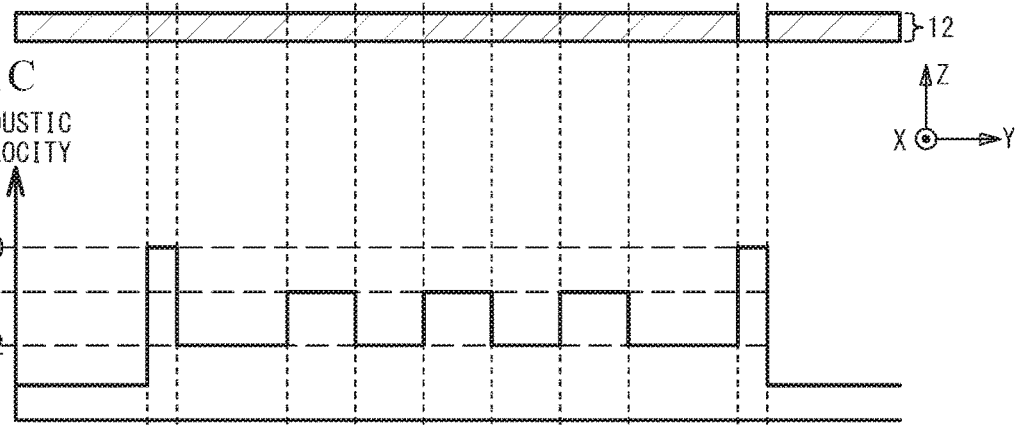
FIG. 11D
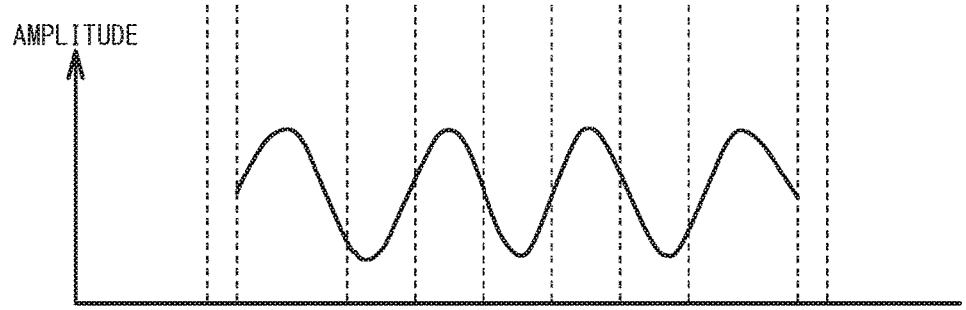

ACOUSTIC WAVE RESONATOR, FILTER, AND MULTIPLEXER

CROSS-REFERENCE TO RELATED APPLICATION

This application is based upon and claims the benefit of priority of the prior Japanese Patent Application No. 2016-048494, filed on Mar. 11, 2016, the entire contents of which are incorporated herein by reference.

FIELD

A certain aspect of the present invention relates to an acoustic wave resonator, a filter, and a multiplexer.

BACKGROUND

Systems for high frequency communications typified by mobile phones have used high-frequency filters to remove unnecessary signals other than the frequency band used for communication. Acoustic wave resonators such as surface acoustic wave (SAW) resonators have been used for the high-frequency filters. In the SAW resonator, an Interdigital Transducer (IDT) including a plurality of electrode fingers is formed on a piezoelectric substrate such as a lithium tantalate ($LiTaO_3$) substrate or a lithium niobate ($LiNbO_3$) substrate. The region where the electrode fingers of the IDT overlap is an overlap region. The IDT excites a Shear Horizontal (SH) wave (leaky wave), a Rayleigh wave, or a boundary acoustic wave that is a type of the surface acoustic wave. Reflectors located at the both sides in the main propagation direction of the acoustic wave excited by the IDT confine the acoustic waves around the IDT. The use of the acoustic wave resonators allows for making of a ladder-type filter and a multimode filter.

International Publication No. 2015/007319 and U.S. Pat. No. 7,939,987 disclose that regions with different acoustic velocities of acoustic waves are periodically arranged at regular intervals in the extension direction of the electrode fingers in the overlap region.

When the regions with different acoustic velocities of acoustic waves are arranged at regular intervals, lateral-mode spurious can be reduced. However, the degree of reduction of the lateral-mode spurious is insufficient.

SUMMARY OF THE INVENTION

According to a first aspect of the present invention, there is provided an acoustic wave resonator including: a piezoelectric substrate; and an IDT that is located on the piezoelectric substrate and includes first regions and second regions alternately arranged in an extension direction of electrode fingers, which excite an acoustic wave, in an overlap region in which the electrode fingers overlap, at least one electrode finger of the electrode fingers in the second regions having a different width from the at least one electrode finger in the first regions, a width of an outer second region of the second regions in the extension direction differing from a width of an inner second region of the second regions.

According to a second aspect of the present invention, there is provided an acoustic wave resonator including: a piezoelectric substrate; and an IDT that is located on the piezoelectric substrate and includes first regions and second regions alternately arranged in an extension direction of electrode fingers, which excite an acoustic wave, in an overlap region in which the electrode fingers overlap, at least one electrode finger of the electrode fingers in the second regions having a different width from the at least one electrode finger in the first regions, the at least one electrode finger in an outer second region of the second regions having a different width from the at least one electrode finger in an inner second region of the second regions.

According to a third aspect of the present invention, there is provided an acoustic wave resonator including: a piezoelectric substrate; an IDT that is located on the piezoelectric substrate, and includes an overlap region in which electrode fingers exciting an acoustic wave overlap; and an additional film that is located on at least one of the electrode fingers and includes first regions and second regions alternately arranged in an extension direction of the electrode fingers in the overlap region, a thickness of the additional film in the second regions differing from a thickness of the additional film in the first regions, at least one of a width and a thickness of an outer second region of the second regions in the extension direction differing from the at least one of a width and a thickness of an inner second region of the second regions in the extension direction.

According to a fourth aspect of the present invention, there is provided an acoustic wave resonator including: a piezoelectric substrate; and an IDT that is located on the piezoelectric substrate and includes first regions and second regions alternately arranged in an extension direction of electrode fingers, which excite an acoustic wave, in an overlap region in which the electrode fingers overlap, an acoustic velocity of the acoustic wave in the second regions differing from an acoustic velocity of the acoustic wave in the first regions, a width of an outer second region of the second regions in the extension direction differing from a width of an inner second region of the second regions in the extension direction.

According to a fifth aspect of the present invention, there is provided a filter including: any one of the above acoustic wave resonators.

According to a sixth aspect of the present invention, there is provided a multiplexer including: the above filter.

BRIEF DESCRIPTION OF THE DRAWINGS

FIG. 9A is a plan view of a part of an acoustic wave resonator in accordance with a second embodiment, FIG. 9B is a cross-sectional view taken along line A-A in FIG. 9A, and FIG. 9C and FIG. 9D illustrate the acoustic velocity and the amplitude of the acoustic wave in the overlap region, respectively;

FIG. 11A is a plan view of a part of an acoustic wave resonator in accordance with a second variation of the second embodiment, FIG. 11B is a cross-sectional view taken along line A-A in FIG. 11A, and FIG. 11C and FIG. 11D illustrate the acoustic velocity and the amplitude of the acoustic wave in the overlap region, respectively.

DETAILED DESCRIPTION

Figure 1A:
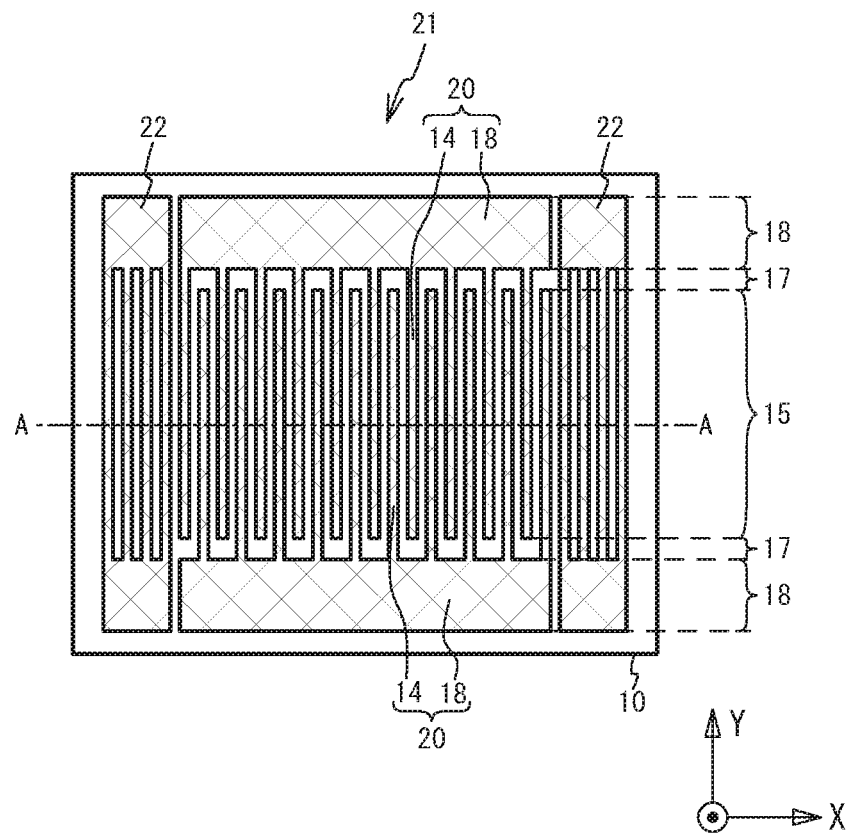
FIG. 1A is a plan view of an acoustic wave resonator in accordance with comparative examples and embodiments.
Figure 1B:
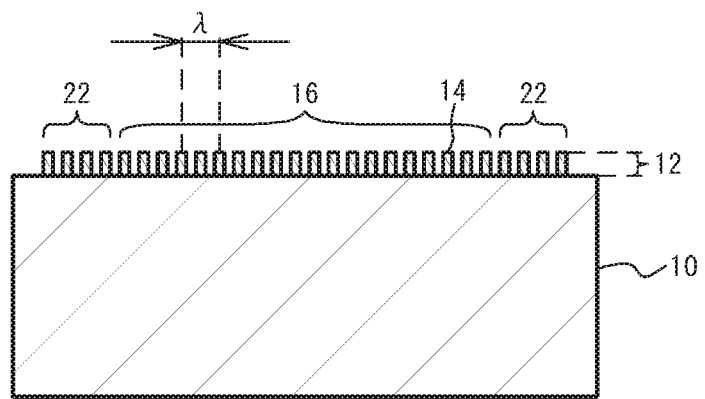
FIG. 1B is a cross-sectional view taken along line A-A in FIG. 1A.

The structure of acoustic wave resonators in accordance with comparative examples and embodiments will be described. FIG. 1A is a plan view of an acoustic wave resonator in accordance with the comparative examples and the embodiments, and FIG. 1B is a cross-sectional view taken along line A-A in FIG. 1A. As illustrated in FIG. 1A and FIG. 1B, an IDT 21 and reflectors 22 are formed on a piezoelectric substrate 10. The IDT 21 and the reflectors 22 are formed of a metal film 12 formed on the piezoelectric substrate 10. The IDT 21 includes a pair of comb-shaped electrodes 20 facing each other. The comb-shaped electrode 20 includes a plurality of electrode fingers 14 and a bus bar 18 to which the electrode fingers 14 are connected. The pair of comb-shaped electrodes 20 are arranged so as to face each other so that the electrode fingers 14 of one of the comb-shaped electrodes 20 and the electrode fingers 14 of the other are arranged substantially in an alternate order.

The region where the electrode fingers 14 of one of the comb-shaped electrodes 20 overlap with the electrode fingers 14 of the other is an overlap region 15. In the overlap region 15, an acoustic wave excited by the electrode fingers 14 mainly propagates in the alignment direction of the electrode fingers 14. The pitch of the electrode fingers 14 is approximately equal to the wavelength λ of the acoustic wave. On the other hand, the region between the tips of the electrode fingers 14 of one of the comb-shaped electrodes 20 and the bus bar 18 of the other of the comb-shaped electrodes 20 is a gap region 17. When dummy electrode fingers are provided, the gap region is the region between the tips of the electrode fingers and the tips of the dummy electrode fingers. The propagation direction of the acoustic wave is defined as an X direction, and the direction perpendicular to the propagation direction is defined as a Y direction. The X direction and the Y direction do not always correspond to the X-axis direction and the Y-axis direction of the crystal orientation of the piezoelectric substrate 10, respectively. The piezoelectric substrate 10 is, for example, a lithium tantalate substrate or a lithium niobate substrate. The metal film 12 is, for example, an aluminum film or a copper film.

In the following comparative examples and embodiments, an exemplary case where the anisotropy coefficient γ is positive will be described. The anisotropy coefficient γ is determined depending on the material of the piezoelectric substrate 10, the material, the film thickness, and the pitch of the IDT 21. For example, when the piezoelectric substrate 10 is a rotated Y-cut X-propagation lithium niobate substrate, the anisotropy coefficient γ is positive. When the piezoelectric substrate 10 is a rotated Y-cut X-propagation lithium tantalate substrate, the anisotropy coefficient γ is negative. When a rotated Y-cut X-propagation lithium tantalate substrate is used, the IDT 21 is made of a heavy material, and the film thickness of the IDT 21 is large, the anisotropy coefficient γ may be positive.

Figure 2A:
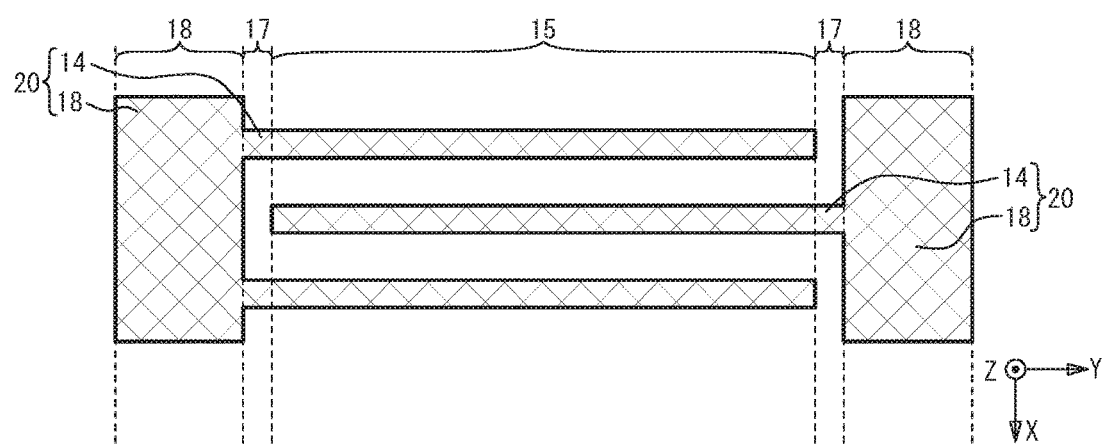
FIG. 2A is a plan view of a part of an acoustic wave resonator in accordance with a first comparative example.
Figure 2B:
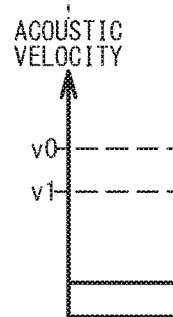
FIG. 2B illustrates an acoustic velocity in each region.

Next, the comparative examples will be described. FIG. 2A is a plan view of a part of an acoustic wave resonator in accordance with a first comparative example, and FIG. 2B illustrates an acoustic velocity in each region. The acoustic velocity of FIG. 2B is the acoustic velocity of the acoustic wave propagating in the Y direction. However, since the acoustic velocity of the acoustic wave propagating in the X direction is substantially proportional to the acoustic velocity of the acoustic wave propagating in the Y direction, the acoustic velocity of FIG. 2B may be considered as the acoustic velocity of the acoustic wave propagating in the X direction. The same applies to other drawings. The acoustic velocity v0 in the gap region 17 is set faster than the acoustic velocity v1 in the overlap region 15. This setting causes the acoustic wave to be confined in the overlap region 15. However, when a standing wave of the acoustic wave propagating in the Y direction is formed in the overlap region 15, lateral-mode spurious occurs. Periodical lateral-mode spurious occurs at frequencies according to the order of the standing wave.

Figure 3A:
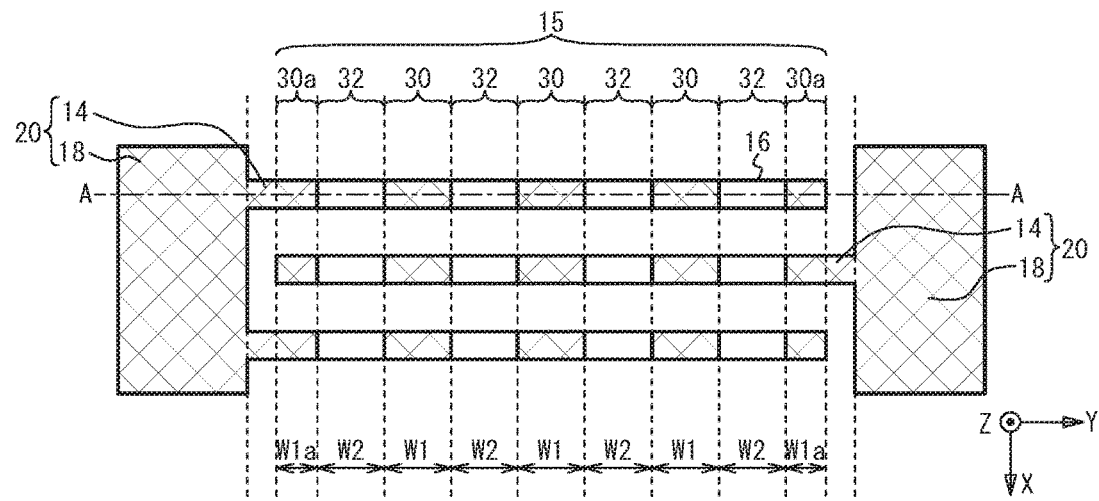
FIG. 3A is a plan view of a part of an acoustic wave resonator in accordance with a second comparative example.
Figure 3B:
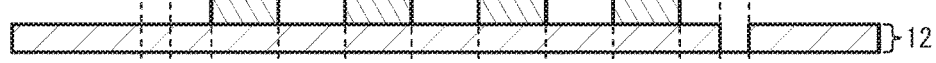
FIG. 3B is a cross-sectional view taken along line A-A in FIG. 3A, and FIG. 3C and FIG. 3D illustrate the acoustic velocity and the amplitude of an acoustic wave in an overlap region, respectively.
Figure 3C:
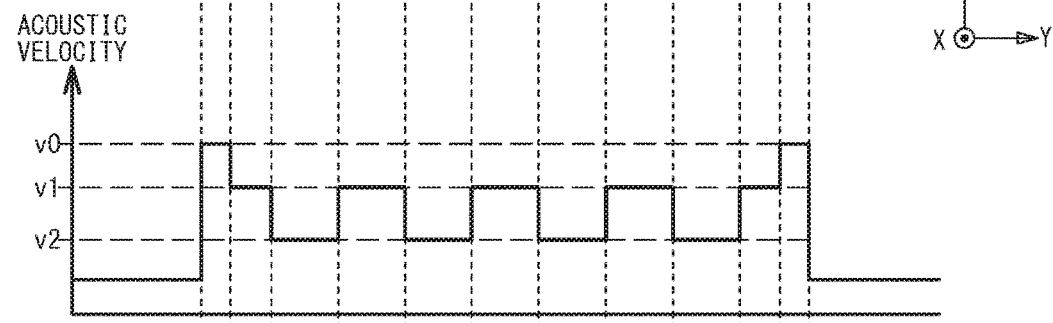
Figure 3D:
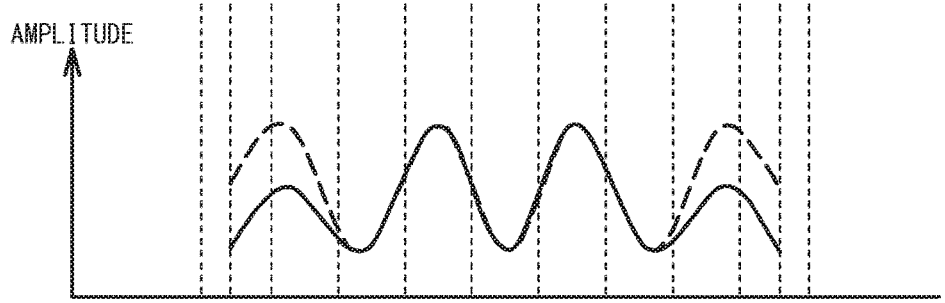

FIG. 3A is a plan view of a part of an acoustic wave resonator in accordance with a second comparative example, FIG. 3B is a cross-sectional view taken along line A-A in FIG. 3A, and FIG. 3C and FIG. 3D illustrate the acoustic velocity and the amplitude of the acoustic wave in the overlap region, respectively. As illustrated in FIG. 3A and FIG. 3B, an additional film 16 is periodically located on each electrode finger 14. Regions where the additional film 16 is not formed are first regions 30 and 30a, and regions where the additional film 16 is formed is second regions 32. The width W1 of the first region 30 in the Y direction is equal to the width W2 of the second region 32 in the Y direction. The first region 30a that is the outermost region within the overlap region 15 has a width W1a. The width W1a is approximately a half of the width W1.

As illustrated in FIG. 3C, the provision of the additional film 16 on the electrode finger 14 makes the acoustic velocity of the acoustic wave less. Thus, the acoustic velocity v2 in the second regions 32 is less than the acoustic velocity v1 in the first regions 30 and 30a. As described above, the first regions 30 in which the acoustic velocity is high and the second regions 32 in which the acoustic velocity is low are alternately arranged in the overlap region 15. As illustrated in FIG. 3D, the acoustic wave tends to concentrate in the second regions 32 in which the acoustic velocity is low. Thus, as indicated by the dashed line, the acoustic wave tends to become the antinode of the standing wave in the second region 32. Accordingly, a standing wave having an order corresponding to the number of the second regions 32 is formed, and standing waves with other orders are not formed. As described above, a single-mode standing wave is formed. An emphasis mode response is formed at a frequency corresponding to the single-mode standing wave, but no lateral-mode spurious is formed at other frequencies.

As indicated by the dashed line, the ideal amplitude of the standing wave is a uniform amplitude throughout the overlap region 15. However, the physical properties such as acoustic velocity differ between when the overlap region 15 is viewed at the boundary between the overlap region 15 and the gap region 17 and when the gap region 17 is viewed at the boundary between the overlap region 15 and the gap region 17. Thus, as indicated by the solid line, the amplitude of the standing wave at the edge of the overlap region 15 differs from the amplitude of the standing wave at the center of the overlap region 15. Therefore, a component of a standing wave other than the single-mode standing wave is produced, and the degree of reduction of the lateral-mode spurious becomes insufficient.

First Embodiment

Figure 4A:
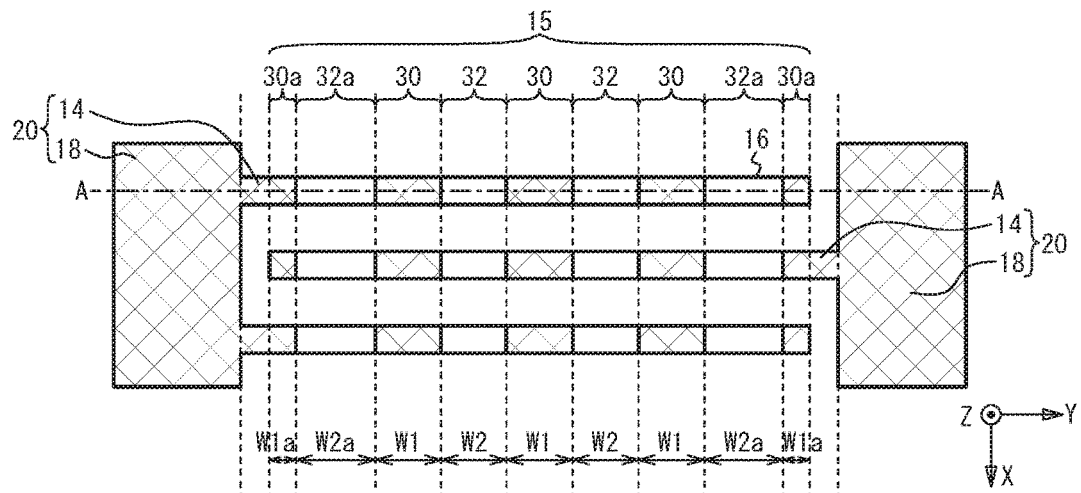
FIG. 4A is a plan view of a part of an acoustic wave resonator in accordance with a first embodiment.
Figure 4B:
FIG. 4B is a cross-sectional view taken along line A-A in FIG. 4A, and FIG. 4C and FIG. 4D illustrate the acoustic velocity and the amplitude of the acoustic wave in the overlap region, respectively.
Figure 4C:
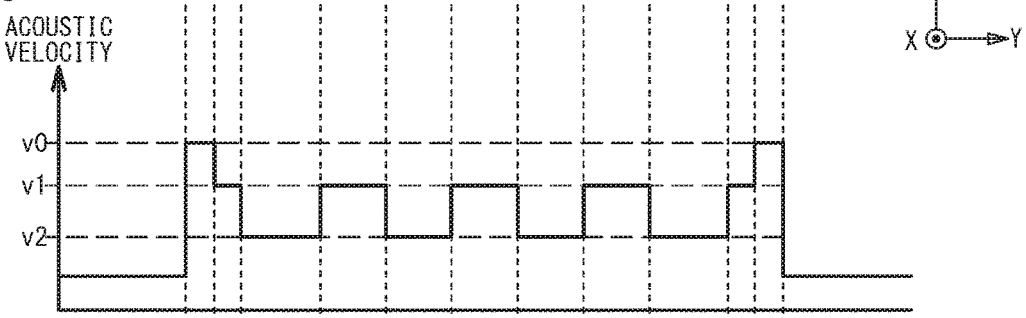
Figure 4D:
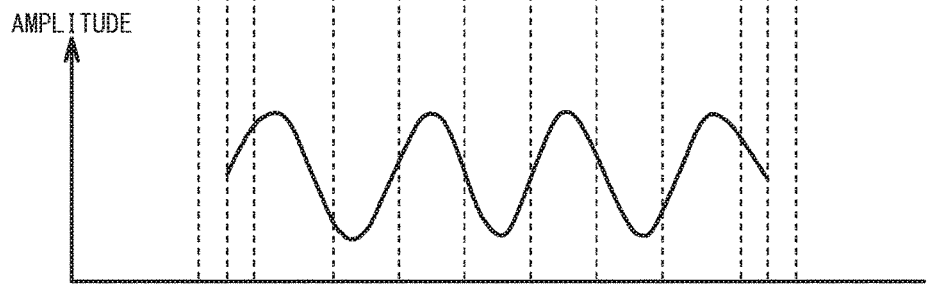

FIG. 4A is a plan view of a part of an acoustic wave resonator in accordance with a first embodiment, FIG. 4B is a cross-sectional view taken along line A-A in FIG. 4A, and FIG. 4C and FIG. 4D illustrate the acoustic velocity and the amplitude of the acoustic wave in the overlap region, respectively. As illustrated in FIG. 4A and FIG. 4B, the additional film 16 is formed on each electrode finger 14. The additional film 16 may be made of a metallic material such as copper, chrome, tungsten, aluminum, or ruthenium, or an insulating material such as silicon nitride, silicon oxide, aluminum oxide, or tantalum oxide. The additional film 16 and the electrode fingers 14 may be made of the same material. The width W2a of an outermost second region 32a is greater than the widths W1 and W2 of the inner first region 30 and the inner second region 32. Other structures are the same as those of the second comparative example, and the description thereof is thus omitted.

As illustrated in FIG. 4C, when the width W2a of the outermost second region 32a is wide, the acoustic wave energy tends to concentrate on the edges in the overlap region 15. This makes it easier for the acoustic wave to exist in the second region 32a within the overlap region 15. Therefore, as illustrated in FIG. 4D, the amplitude of the acoustic wave at the edge in the overlap region 15 increases, and becomes equal to the amplitude of the acoustic wave at the center in the overlap region 15. Thus, the components of standing waves with orders other than the order of a single-mode standing wave are reduced. Therefore, the lateral-mode spurious at frequencies other than the frequency corresponding to a single-mode standing wave is reduced.

In the first embodiment, the additional film 16 is provided so that the first regions 30 and 30a and the second regions 32 and 32a are alternately arranged in the Y direction (in the extension direction of the electrode fingers 14) in the overlap region 15. The additional film 16 in the second regions 32 and 32a is thicker than the additional film 16 in the first regions 30 and 30a. The width W2a of the outer second region 32a in the Y direction is wider than the width W2 of the inner second region 32 in the Y direction. This structure makes the amplitude of the standing wave in the overlap region 15 uniform, reducing spurious.

In FIG. 3D of the second comparative example, the amplitude of the standing wave in the outer region of the overlap region 15 may be greater than the amplitude of the standing wave in the inner region of the overlap region 15. In this case, the width W2a of the outer second region 32a in the Y direction is made to be less than the width W2 of the inner second region 32 in the Y direction. Alternatively, when the amplitude of the standing wave at the edge of the overlap region 15 is smaller than the amplitude of the standing wave at the center, the width of the outer first region 30 in the Y direction may be made to be less than the width of the inner first region 30 in the Y direction.

As described above, it is only required that the film thickness of the additional film 16 in the first regions 30 and 30a differs from the film thickness of the additional film 16 in the second regions 32 and 32a, and the width W2a of the outer second region 32a in the Y direction differs from the width W2 of the second region 32 in the Y direction. The film thickness of the additional film 16 in the first regions 30 and 30a and/or the second regions 32 and 32a may be zero. When the additional film 16 and the electrode fingers 14 are made of the same material, the film thickness of the electrode finger 14 in the first regions 30 and 30a differs from the film thickness of the electrode finger 14 in the second regions 32 and 32a.

Figure 5A:
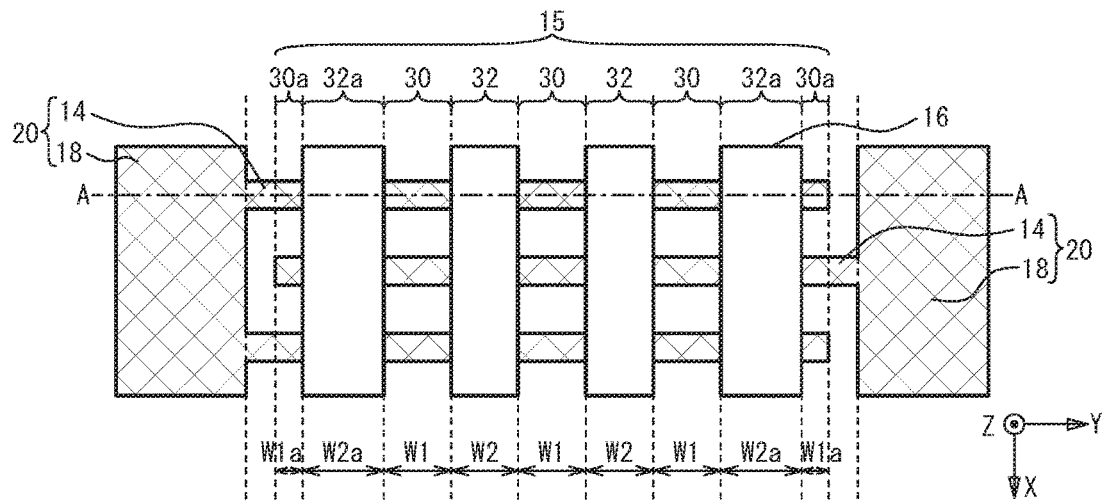
FIG. 5A is a plan view of a part of an acoustic wave resonator in accordance with a first variation of the first embodiment.
Figure 5B:
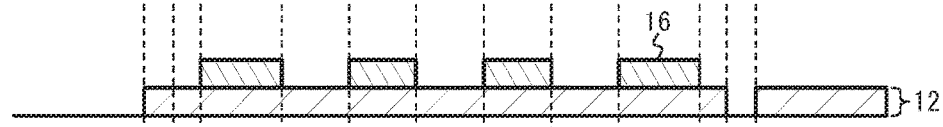
FIG. 5B is a cross-sectional view taken along line A-A in FIG. 5A, and FIG. 5C and FIG. 5D illustrate the acoustic velocity and the amplitude of the acoustic wave in the overlap region, respectively.
Figure 5C:
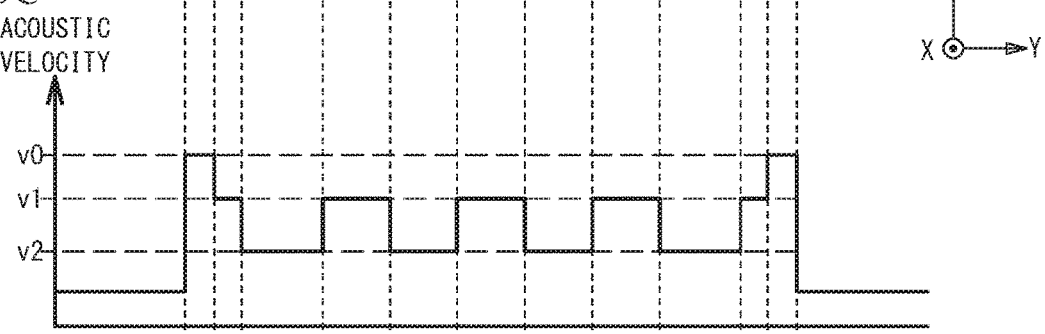
Figure 5D:
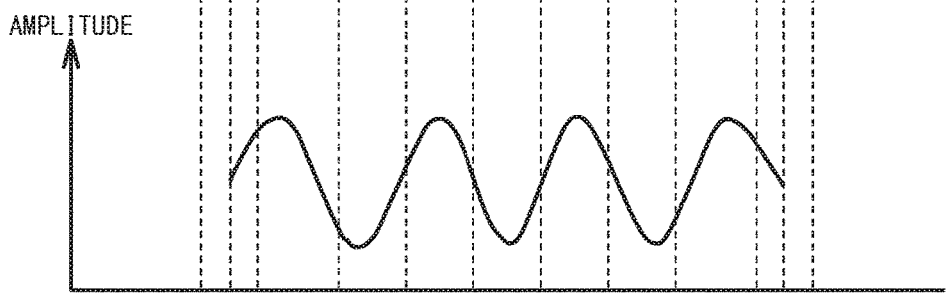

FIG. 5A is a plan view of a part of an acoustic wave resonator in accordance with a first variation of the first embodiment, FIG. 5B is a cross-sectional view taken along line A-A in FIG. 5A, and FIG. 5C and FIG. 5D illustrate the acoustic velocity and the amplitude of the acoustic wave in the overlap region, respectively. As illustrated in FIG. 5A and FIG. 5B, the additional film 16 on the electrode fingers 14 is also located on the piezoelectric substrate 10 between the electrode fingers 14. To prevent a short-circuit between the electrode fingers 14, the additional film 16 is preferably an insulating film. The additional film 16 may be made of the same material as a protective film formed so as to cover the electrode fingers 14. Other structures are the same as those of the first variation of the first embodiment, and the description thereof is thus omitted.

As illustrated in FIG. 5C and FIG. 5D, the width W2a of the outermost second region 32a becomes wide, and the amplitude of the acoustic wave at the edge in the overlap region 15 becomes approximately equal to the amplitude of the acoustic wave at the center in the overlap region 15. Accordingly, as in the first embodiment, spurious due to modes with orders other than the order of a single-mode is reduced.

Figure 6A:
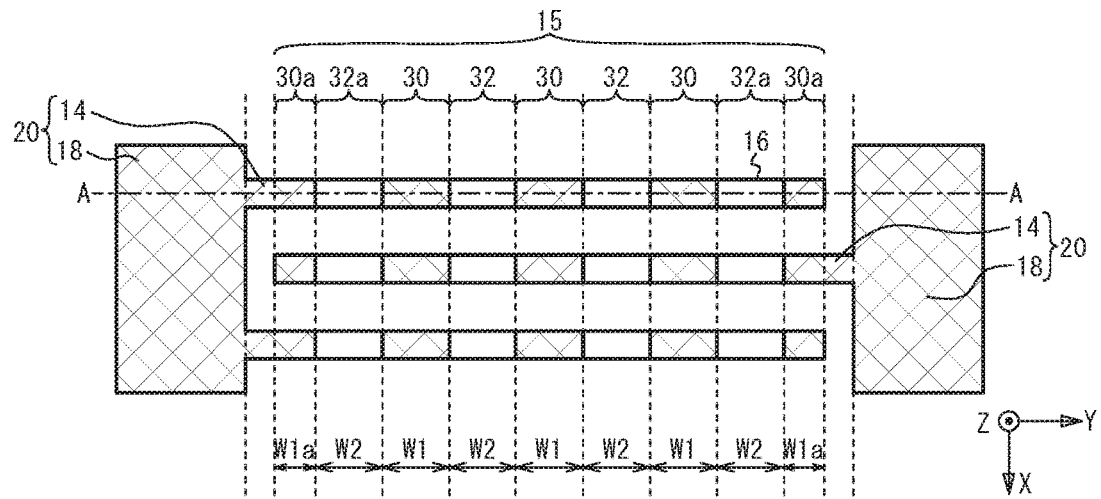
FIG. 6A is a plan view of a part of an acoustic wave resonator in accordance with a second variation of the first embodiment.
Figure 6B:
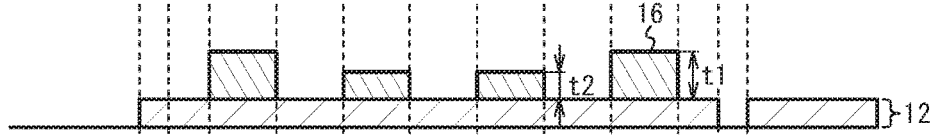
FIG. 6B is a cross-sectional view taken along line A-A in FIG. 6A, and FIG. 6C and FIG. 6D illustrate the acoustic velocity and the amplitude of the acoustic wave in the overlap region, respectively.
Figure 6C:
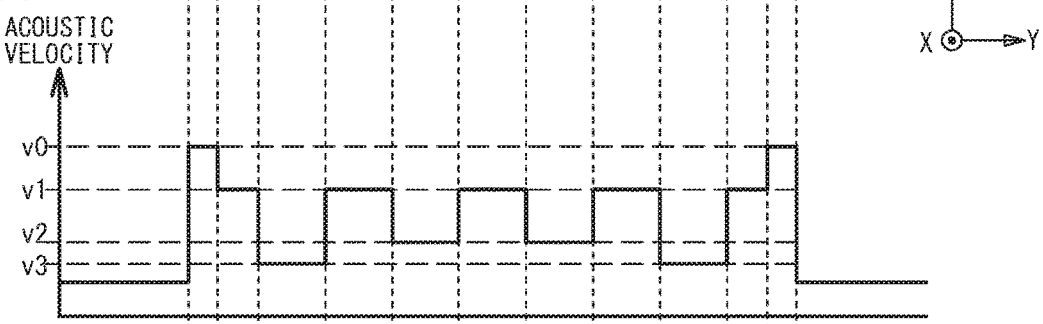
Figure 6D:
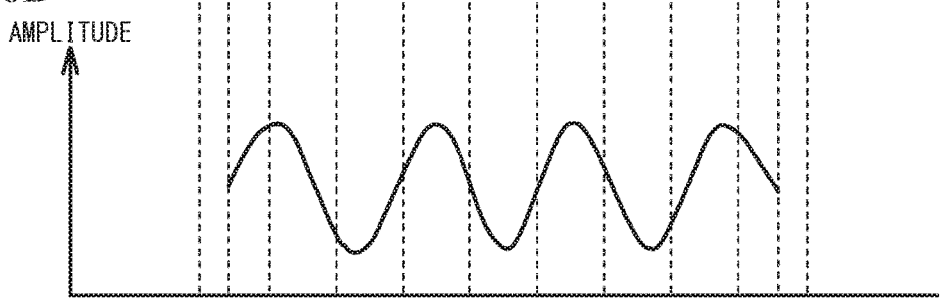

FIG. 6A is a plan view of a part of an acoustic wave resonator in accordance with a second variation of the first embodiment, FIG. 6B is a cross-sectional view taken along line A-A in FIG. 6A, and FIG. 6C and FIG. 6D illustrate the acoustic velocity and the amplitude of the acoustic wave in the overlap region, respectively. As illustrated in FIG. 6A and FIG. 6B, the film thickness t1 of the additional film 16 located in the outermost second region 32a is greater than the film thickness t2 of the additional film 16 located in the central second region 32. Other structures are the same as those of the first embodiment, and the description thereof is omitted.

As illustrated in FIG. 6C, when the film thickness t1 of the additional film 16 is greater than the film thickness t2, the acoustic velocity v3 of the acoustic wave is less than the acoustic velocity v2. As illustrated in FIG. 6D, the acoustic velocity v3 in the outer second region 32a becomes less than the acoustic velocity v2 in the inner second region 32. Accordingly, the acoustic wave energy concentrates in the outer region. Therefore, the amplitude of the acoustic wave becomes uniform in the overlap region 15. As a result, as in the first embodiment, spurious due to modes with orders other than the order of a single-mode is reduced.

As in the second variation of the first embodiment, the additional film 16 in the second regions 32 and 32a is thicker than the additional film 16 in the first regions 30 and 30a. The additional film 16 in the outer second region 32a is thicker than the additional film 16 in the inner second region 32. More generally, it is only required that the film thickness of the additional film 16 in the first regions 30 and 30a differs from the film thickness of the additional film 16 in the second regions 32 and 32a and the additional film 16 in the outer second region 32a has a different thickness from the additional film 16 in the inner second region 32. This structure can reduce spurious as in the first embodiment.

The widths W2a and W2 of the outer second region 32a and the inner second region 32 in the Y direction may be the same or different. For example, as in the first embodiment, the width W2a of the outer second region 32a may be greater than the width W2 of the inner second region 32.

Figure 7A:
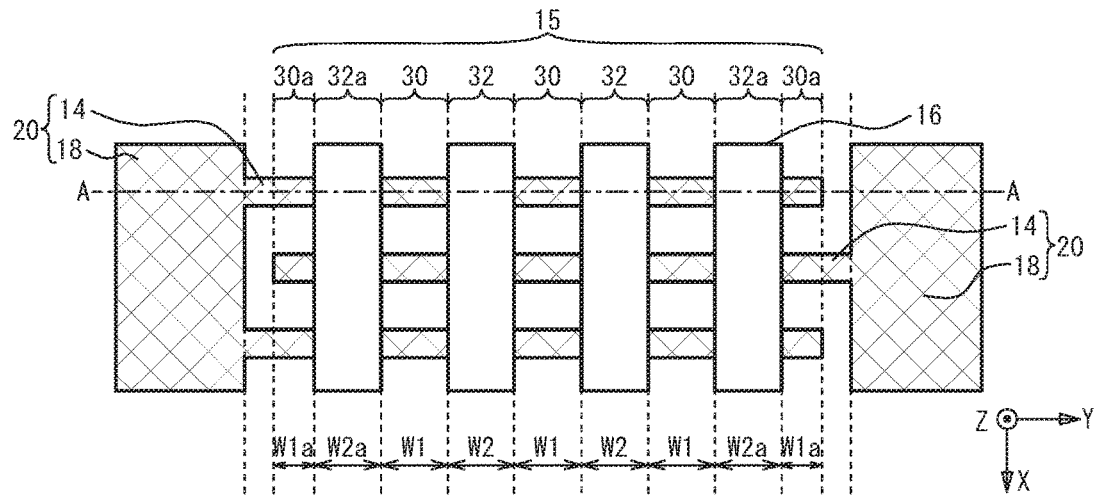
FIG. 7A is a plan view of a part of an acoustic wave resonator in accordance with a third variation of the first embodiment.
Figure 7B:
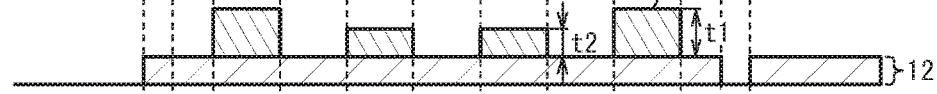
FIG. 7B is a cross-sectional view taken along line A-A in FIG. 7A, and FIG. 7C and FIG. 7D illustrate the acoustic velocity and the amplitude of the acoustic wave in the overlap region, respectively.
Figure 7C:
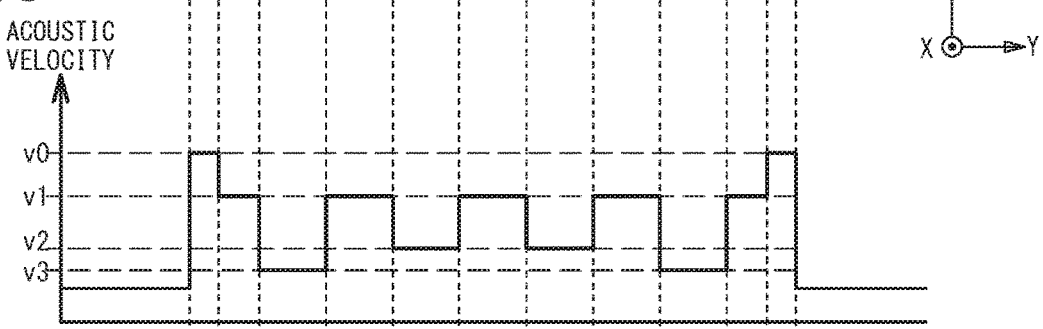
Figure 7D:
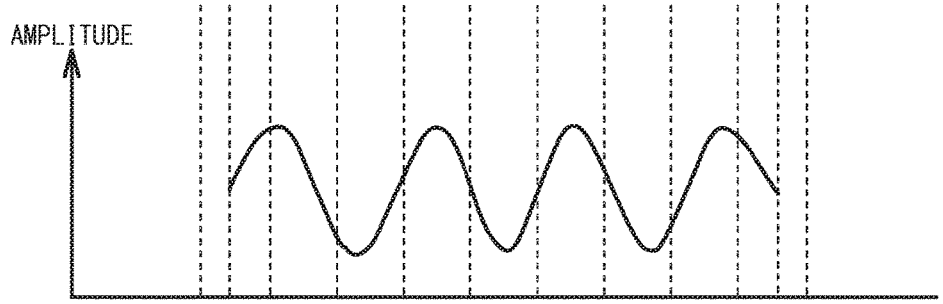

FIG. 7A is a plan view of a part of an acoustic wave resonator in accordance with a third variation of the first embodiment, FIG. 7B is a cross-sectional view taken along line A-A in FIG. 7A, and FIG. 7C and FIG. 7D illustrate the acoustic velocity and the amplitude of the acoustic wave in the overlap region, respectively. As illustrated in FIG. 7A and FIG. 7B, the additional film 16 on the electrode fingers 14 is also located on the piezoelectric substrate 10 between the electrode fingers 14. To prevent a short-circuit between the electrode fingers 14, the additional film 16 is preferably an insulating film. The additional film 16 may be made of the same material as a protective film formed so as to cover the electrode fingers 14. Other structures are the same as those of the second variation of the first embodiment, and the description thereof is thus omitted.

As illustrated in FIG. 7C and FIG. 7D, also in the third variation of the first embodiment, the amplitude of the acoustic wave at the outer region in the overlap region 15 becomes approximately the same as the amplitude of the acoustic wave at the center. Accordingly, as in the first embodiment and the second embodiment, spurious due to modes with orders other than the order of a single-mode is reduced.

Spurious was simulated for the first comparative example, the second comparative example, and the first variation of the first embodiment. The simulation conditions are as follows.
Piezoelectric substrate 10: 42° rotated Y-cut X-propagation lithium tantalate substrate
Pitch λ of the IDT 21: 3.84 µm (corresponding to a resonant frequency of approximately 800 MHz)
Material of the IDT 21: copper
Film thickness of the IDT 21: 0.1λ
Aperture length (the width of the overlap region 15): 20λ
Duty ratio of the electrode finger of the IDT 21: 50%
Material of the additional film 16: aluminum oxide ($Al_2O_3$)
Film thickness of the additional film 16: 0.03125λ
First comparative example: No additional film 16 is provided.
Second comparative example: W1=W2=2.5λ, W1a=1.25λ
First variation of the first embodiment: W1=2.625λ, W2=2.25λ, W1a=1.3125λ, W2a=2.5λ

Figure 8:
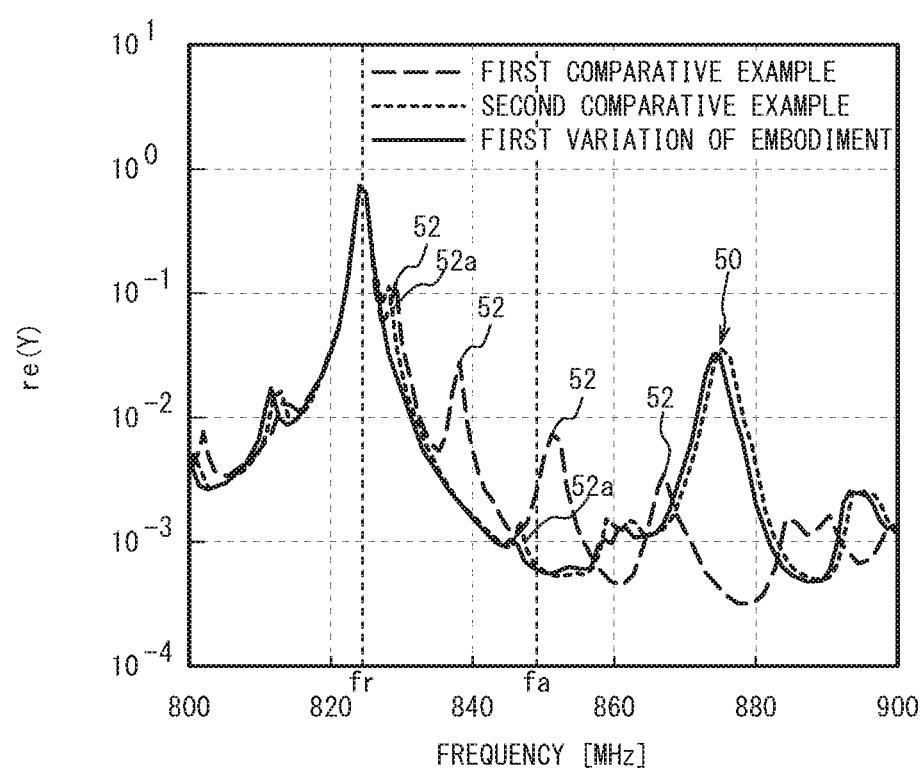
FIG. 8 is a graph of the real part (conductance) of the admittance Y of the acoustic wave resonator versus frequency in the first and second comparative examples and the first variation of the first embodiment.

FIG. 8 is a graph of the real part (conductance) of the admittance Y of the acoustic wave resonator versus frequency in the first and second comparative examples and the first variation of the first embodiment. As illustrated in FIG. 8, the conductance reaches a maximum at the resonant frequency fr, and the conductance reaches a minimum at the antiresonant frequency fa. In the first comparative example, periodical spurious 52 is formed. Especially a frequency band between the resonant frequency fr and the antiresonant frequency fa is located in the passband in a ladder-type filter. Thus, it is required to reduce the spurious 52 between the resonant frequency fr and the antiresonant frequency fa.

In the second comparative example, the spurious 52 decreases, and an emphasis mode 50 is formed. The emphasis mode 50 is due to a single-mode standing wave. Between the resonant frequency fr and the antiresonant frequency fa, although the spurious 52 becomes small, but small spurious 52a is observed.

In the first variation of the first embodiment, between the resonant frequency fr and the antiresonant frequency fa, the spurious 52a is hardly formed. This is considered because the amplitude of the single-mode standing wave becomes uniform in the overlap region 15, and thereby the components of modes with other orders become non-existent.

In the first embodiment and the variations thereof, it is only required that the film thickness of the additional film 16 on the electrode finger 14 in the second regions 32 and 32a differs from the film thickness of the additional film 16 on the electrode finger 14 in the first regions 30 and 30a in at least one of the electrode fingers 14. It is preferable that the film thickness of the additional film 16 on the electrode finger 14 in the second regions 32 and 32a differs from the film thickness of the additional film 16 on the electrode finger 14 in the first regions 30 and 30a in more than 50% of the electrode fingers 14. It is more preferable that the film thickness of the additional film 16 on the electrode finger 14 in the second regions 32 and 32a differs from the film thickness of the additional film 16 on the electrode finger 14 in the first regions 30 and 30a in all the electrode fingers 14.

Second Embodiment

FIG. 9A is a plan view of a part of an acoustic wave resonator in accordance with a second embodiment, FIG. 9B is a cross-sectional view taken along line A-A in FIG. 9A, and FIG. 9C and FIG. 9D illustrate the acoustic velocity and the amplitude of the acoustic wave in the overlap region, respectively. As illustrated in FIG. 9A and FIG. 9B, the additional film 16 is not located on the electrode fingers 14. The width W4 of the electrode finger 14 in the second regions 32 is greater than the width W3 of the electrode finger 14 in the first regions 30 and 30a. The width W2a of the outer second region 32a is greater than the width W2 of the central second region 32. Other structures are the same as those of the first embodiment, and the description thereof is thus omitted.

As illustrated in FIG. 9C, when the width of the electrode finger 14 increases, the acoustic velocity becomes slower. Thus, the acoustic velocity v2 in the second regions 32 and 32a is less than the acoustic velocity v0 in the first regions 30 and 30a. Accordingly, as in the first embodiment, the amplitude of the standing wave can be made to be uniform as illustrated in FIG. 9D.

In the second embodiment, at least one electrode finger 14 in the second regions 32 and 32a is wider than the at least one electrode finger 14 in the first regions 30 and 30a. The width W2a of the outer second region 32a in the Y direction is wider than the width W2 of the inner second region 32 in the Y direction. More generally, at least one electrode finger 14 in the second regions 32 and 32a has a different width from the at least one electrode finger 14 in the first regions 30 and 30a. The width W2a of the outer second region 32a in the Y direction differs from the width W2 of the inner second region 32 in the Y direction. This structure can reduce spurious as in the first embodiment.

Figure 10A:
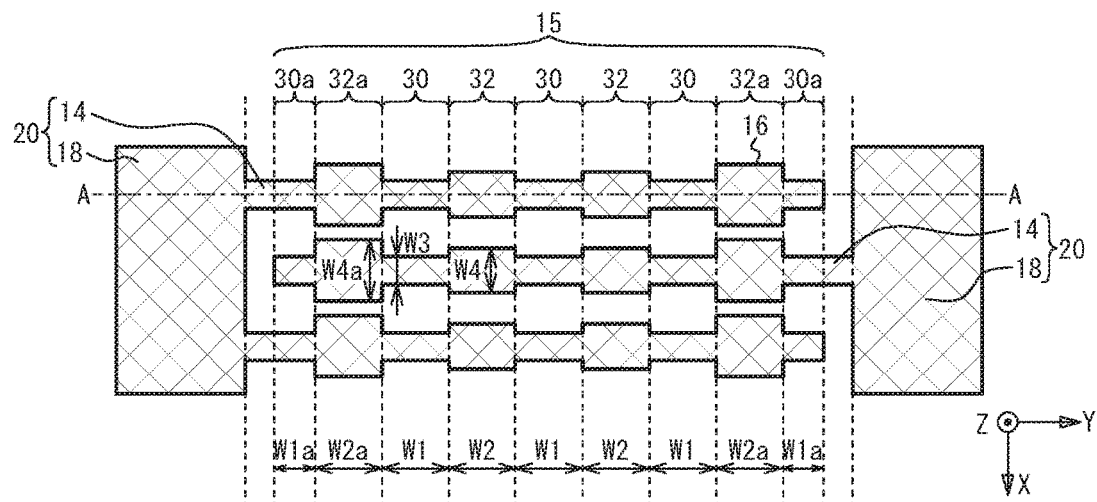
FIG. 10A is a plan view of a part of an acoustic wave resonator in accordance with a first variation of the second embodiment.
Figure 10B:
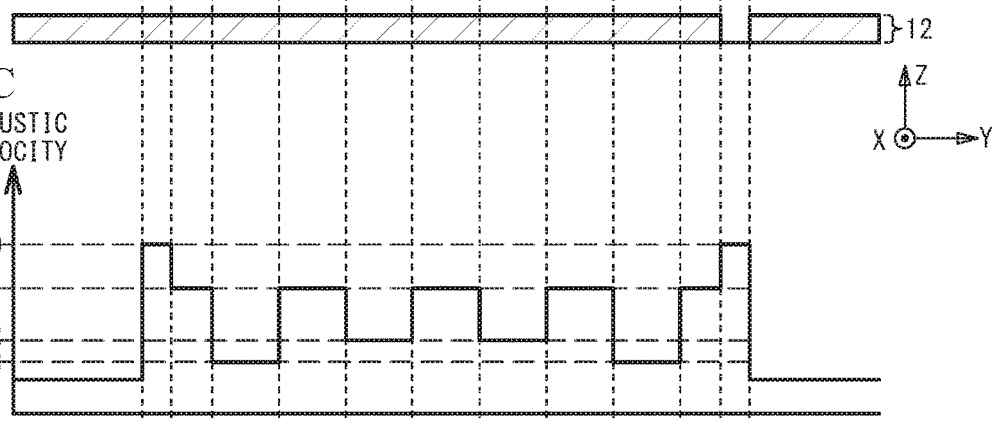
FIG. 10B is a cross-sectional view taken along line A-A in FIG. 10A, and FIG. 10C and FIG. 10D illustrate the acoustic velocity and the amplitude of the acoustic wave in the overlap region, respectively.
Figure 10C:
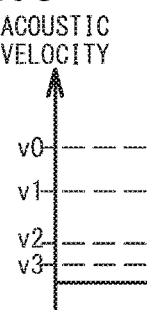
Figure 10D:
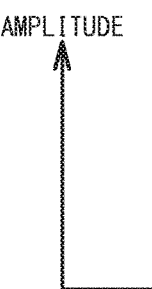

FIG. 10A is a plan view of a part of an acoustic wave resonator in accordance with a first variation of the second embodiment, FIG. 10B is a cross-sectional view taken along line A-A in FIG. 10A, and FIG. 10C and FIG. 10D illustrate the acoustic velocity and the amplitude of the acoustic wave in the overlap region, respectively. As illustrated in FIG. 10A and FIG. 10B, the width W2a of the outer second region 32a is the same as the width W2 of the central second region 32. The width W4a of the electrode finger 14 in the outer second region 32a is greater than the width W4 of the electrode finger 14 in the central second region 32. Other structures are the same as those of the second embodiment, and the description thereof is thus omitted.

As illustrated in FIG. 10C, since the width W4a of the electrode finger 14 in the outer second region 32a is greater than the width W4, the acoustic velocity v3 in the outer second region 32a is less than the acoustic velocity v2 in the central second region 32. Thus, as illustrated in FIG. 10D, the amplitude of the standing wave can be made to be uniform as in the second and third variations of the first embodiment.

In the first variation of the second embodiment, at least one electrode finger 14 in the second regions 32 and 32a is wider than the at least one electrode finger 14 in the first regions 30 and 30a. The at least one electrode finger 14 in the outer second region 32a is wider than the at least one electrode finger 14 in the inner second region 32. More generally, at least one electrode finger 14 in the second regions 32 and 32a has a different width from the at least one electrode finger 14 in the first regions 30 and 30a. The at least one electrode finger 14 in the outer second region 32a has a different width from the at least one electrode finger 14 in the inner second region 32. This structure can reduce spurious as in the first embodiment.

The width W2a of the outer second region 32a in the Y direction and the width W2 of the inner second region 32 in the Y direction may be the same or different. For example, as in the second embodiment, the width W2a of the outer second region 32a may be greater than the width W2 of the inner second region 32.

FIG. 11A is a plan view of a part of an acoustic wave resonator in accordance with a second variation of the second embodiment, FIG. 11B is a cross-sectional view taken along line A-A in FIG. 11A, and FIG. 11C and FIG. 11D illustrate the acoustic velocity and the amplitude of the acoustic wave in the overlap region, respectively. As illustrated in FIG. 11A and FIG. 11B, the outermost regions in the overlap region 15 are the second regions 32a. Other structures are the same as those of the second embodiment, and the description thereof is thus omitted.

As illustrated in FIG. 11C and FIG. 11D, even when the outermost region of the overlap region 15 is the second region 32a, the amplitude of the standing wave is made to be uniform, and spurious can be reduced. In the first and second embodiments and the variations thereof, the outermost region of the overlap region 15 may be the second region 32a.

In the second embodiment and the variations thereof, it is only required that the width of the electrode finger 14 in the second regions 32 and 32a differs from that of the electrode finger 14 in the first regions 30 and 30a in at least one of the electrode fingers 14. It is preferable that the width of the electrode finger 14 in the second regions 32 and 32a differs from that of the electrode finger 14 in the first regions 30 and 30a in more than 50% of the electrode fingers 14. It is more preferable that the width of the electrode finger 14 in the second regions 32 and 32a differs from that of the electrode finger 14 in the first regions 30 and 30a in all the electrode fingers 14.

As described in the first embodiment, the first variation of the first embodiment, and the second embodiment, the acoustic velocity v2 of the acoustic wave in the second regions 32 and 32a is less than the acoustic velocity v1 of the acoustic wave in the first regions 30 and 30a. The width W2a of the outer second region 32a in the Y direction is greater than the width W2 of the inner second region 32 in the Y direction. More generally, the acoustic velocity v2 in the second regions 32 and 32a differs from the acoustic velocity v1 in the first regions 30 and 30a. The width W2a of the outer second region 32 in the Y direction differs from the width W2 of the inner second region 32 in the Y direction. This structure can reduce spurious as in the first embodiment.

As in the second and third variations of the first embodiment and the second variation of the second embodiment, the acoustic velocity v2 of the acoustic wave in the second regions 32 and 32a is less than the acoustic velocity v1 of the acoustic wave in the first regions 30 and 30a. The acoustic velocity v3 in the outer second region 32a is less than the acoustic velocity v2 in the inner second region 32. More generally, the acoustic velocity v2 in the second regions 32 and 32a differs from the acoustic velocity v1 in the first regions 30 and 30a. The acoustic velocity v3 in the outer second region 32a differs from the acoustic velocity v2 in the inner second region 32. This structure can reduce spurious as in the first embodiment.

The first embodiment and the variations thereof and the second embodiment and the variations thereof may be combined. That is, the width of the electrode finger 14 in the second regions 32 and 32a may differ from the width of the electrode finger 14 in the first regions 30 and 30a, and the film thickness of the additional film 16 on the electrode finger 14 in the second regions 32 and 32a may differ from the film thickness of the additional film 16 on the electrode finger 14 in the first regions 30 and 30a. Alternatively, the width of the electrode finger 14 in the outer second region 32a may differ from that of the electrode finger 14 in the inner second region 32, and the film thickness of the additional film 16 on the electrode finger 14 in the outer second region 32a may differ from the film thickness of the additional film 16 on the electrode finger 14 in the inner second region 32.

When the second region 32a is the outermost region of the overlap region 15, the region in which the additional film 16 is thicker or the region in which the electrode finger 14 is wider is located at the outer side. In such a structure, the limitation in manufacturing such as requirement for the accuracy of the pattern alignment increases. Thus, as in the first embodiment through the first variation of the second embodiment, the outermost region of the overlap region 15 is preferably the first region 30a. The width W1a of the outermost first region 30a in the overlap region 15 in the Y direction is less than the width W1 of the inner first region 30 in the Y direction. For example, the width W1a is approximately a half of W1 (for example, ¼ to ¾). This structure can form a single-mode standing wave in the overlap region 15.

To form a single-mode standing wave, the ratio of the sum of the widths of the first regions 30 and 30a in the Y direction in the overlap region 15 and the sum of the widths of the second regions 32 and 32a in the Y direction in the overlap region 15 is preferably approximately 5:5. This ratio may range from, for example, 4:6 to 6:4.

As in the first variation of the first embodiment and the second embodiment, when the width W2a of the outer second region 32a is made to differ from the width W2 of the inner second region 32, for example, W2/W2a=0.9. To form a single-mode standing wave, W2/W2a is preferably 0.8 or greater and 1.2 or less.

When the order of a single-mode is increased (for example, when the number of the first regions 30 and 30a and the second regions 32 and 32a is increased), the frequency of the emphasis mode 50 in FIG. 8 increases. Thus, the frequency of the emphasis mode becomes away from the antiresonant frequency fa, but the effect on suppressing the spurious 52a becomes smaller. In addition, it is not appeared in FIG. 8, but the emphasis mode of the Rayleigh wave that appears at a frequency lower than the resonant frequency fr becomes closer to the resonant frequency fr. When the order of a single-mode is reduced (for example, when the number of the first region 30 and the second regions 32 and 32a is decreased), the effect on suppressing the spurious 52a increases, but the frequency of the emphasis mode 50 becomes lower and closer to the antiresonant frequency fa. The order of the single-mode will be set considering the above facts.

The number of the second regions 32 and 32a is preferably between four and eight. To enhance the symmetry and form a standing wave, the number of the second regions 32 and 32a is preferably an even number. In addition, the second region 32a in which the acoustic velocity differs from that of the inner second region or of which the width differs from that of the inner second region may be located at one side of the overlap region 15, but to uniform the distribution of the standing wave, the second region 32a is preferably located at both sides of the overlap region 15.

The first embodiment, the first variation of the first embodiment, and the second embodiment have described an exemplary case where the width W2a of the outermost second regions 32a is greater than the width W2 of other second regions 32. When six or more second regions 32 and 32a are provided, the widths W2 and W2a of the second regions 32 and 32a may gradually increase from the innermost second region 32 to the outermost second region 32a. The widths of the outermost and second-outermost second regions 32a and 32 may be greater than the width of the innermost second region 32. The same applies to the film thickness of the additional film 16 and the width of the electrode finger 14 in the second and third variations of the first embodiment and the first variation of the second embodiment.

Third Embodiment

Figure 12A:
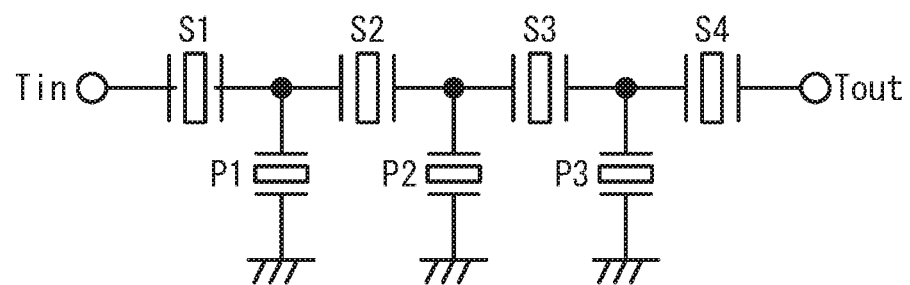
FIG. 12A is a circuit diagram of a filter in accordance with a third embodiment.

A third embodiment is an exemplary filter or an exemplary duplexer using the acoustic wave resonator according to any one of the first and second embodiments and the variations thereof. FIG. 12A is a circuit diagram of a filter in accordance with the third embodiment. As illustrated in FIG. 12A, one or more series resonators S1 through S4 are connected in series between an input terminal Tin and an output terminal Tout. One or more parallel resonators P1 through P3 are connected in parallel between the input terminal Tin and the output terminal Tout. At least one of the one or more series resonators S1 through S4 and the one or more parallel resonators P1 through P3 may be the acoustic wave resonator according to any one of the first and second embodiments and the variations thereof. The filter including the acoustic wave resonator according to any one of the first and second embodiments and the variations thereof may be a multimode filter in addition to a ladder-type filter.

Figure 12B:
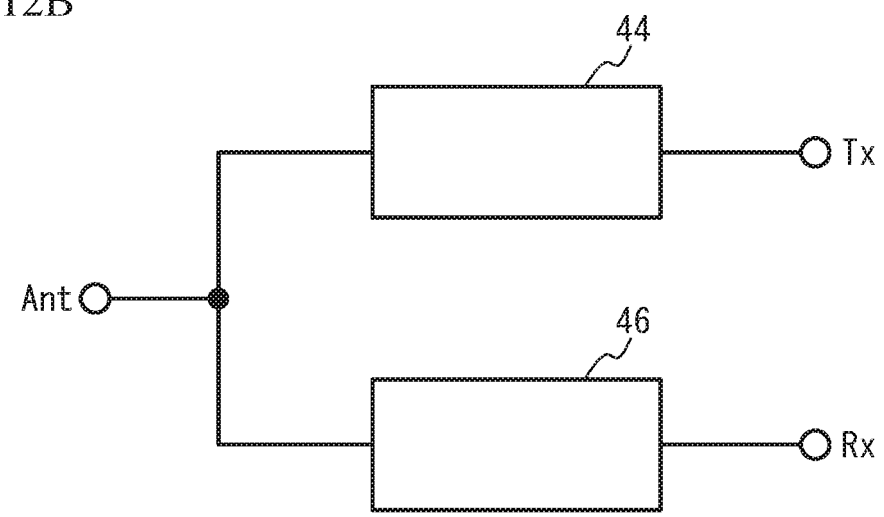
FIG. 12B is a circuit diagram of a duplexer in accordance with a variation of the third embodiment.

FIG. 12B is a circuit diagram of a duplexer in accordance with a variation of the second embodiment. As illustrated in FIG. 12B, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies. At least one of the transmit filter 44 or the receive filter 46 may be the filter of the third embodiment. The duplexer is described as an example, but the same applies to a multiplexer such as a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave resonator comprising:
  a piezoelectric substrate; and
  an IDT that is located on the piezoelectric substrate and includes first regions and second regions alternately arranged in an extension direction of electrode fingers, which excite an acoustic wave, in an overlap region in which the electrode fingers overlap, at least one electrode finger of the electrode fingers in the second regions having a different width from the at least one electrode finger in the first regions, a width of an outer second region of the second regions in the extension direction differing from a width of an inner second region of the second regions,
  wherein a width of an outermost first region of the first regions in the overlap region in the extension direction is less than a width of an inner first region of the first regions in the extension direction.

2. The acoustic wave resonator according to claim 1, wherein
  the at least one electrode finger in the second regions is wider than the at least one electrode finger in the first regions, and
  the width of the outer second region in the extension direction is wider than the width of the inner second region in the extension direction.

3. The acoustic wave resonator according to claim 1, wherein
  outermost regions in the overlap region are the first regions.

4. A filter comprising:
  the acoustic wave resonator according to claim 1.

5. A multiplexer comprising:
a filter according to claim 4.

6. An acoustic wave resonator comprising:
a piezoelectric substrate; and
an IDT that is located on the piezoelectric substrate and includes first regions and second regions alternately arranged in an extension direction of electrode fingers, which excite an acoustic wave, in an overlap region in which the electrode fingers overlap, at least one electrode finger of the electrode fingers in the second regions having a different width from the at least one electrode finger in the first regions, the at least one electrode finger in an outer second region of the second regions having a different width from the at least one electrode finger in an inner second region of the second regions,
wherein a width of an outermost first region of the first regions in the overlap region in the extension direction is less than a width of an inner first region of the first regions in the extension direction.

7. The acoustic wave resonator according to claim 6, wherein
the at least one electrode finger in the second regions is wider than the at least one electrode finger in the first regions, and
the at least one electrode finger in the outer second region is wider than the at least one electrode finger in the inner second region.

8. The acoustic wave resonator according to claim 6, wherein
outermost regions in the overlap region are the first regions.

9. An acoustic wave resonator comprising:
a piezoelectric substrate; and
an IDT that is located on the piezoelectric substrate and includes first regions and second regions alternately arranged in an extension direction of electrode fingers, which excite an acoustic wave, in an overlap region in which the electrode fingers overlap, an acoustic velocity of the acoustic wave in the second regions differing from an acoustic velocity of the acoustic wave in the first regions, a width of an outer second region of the second regions in the extension direction differing from a width of an inner second region of the second regions in the extension direction,
wherein a width of an outermost first region of the first regions in the overlap region in the extension direction is less than a width of an inner first region of the first regions in the extension direction.

10. The acoustic wave resonator according to claim 9, wherein
the acoustic velocity of the acoustic wave in the second regions is less than the acoustic velocity of the acoustic wave in the first regions, and
the width of the outer second region in the extension direction is greater than the width of the inner second region in the extension direction.

11. The acoustic wave resonator according to claim 9, wherein
outermost regions in the overlap region are the first regions.

* * * * *